(12) United States Patent
Kim

(10) Patent No.: US 9,155,191 B2
(45) Date of Patent: Oct. 6, 2015

(54) SUBSTRATE COMPRISING INORGANIC MATERIAL THAT LOWERS THE COEFFICIENT OF THERMAL EXPANSION (CTE) AND REDUCES WARPAGE

(71) Applicant: QUALCOMM Incorporated, San Diego, CA (US)

(72) Inventor: Chin-Kwan Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/967,186

(22) Filed: Aug. 14, 2013

(65) Prior Publication Data

US 2014/0356635 A1 Dec. 4, 2014

Related U.S. Application Data

(60) Provisional application No. 61/829,928, filed on May 31, 2013.

(51) Int. Cl.
| | |
|---|---|
| *B32B 9/00* | (2006.01) |
| *H05K 1/02* | (2006.01) |
| *H05K 3/46* | (2006.01) |

(Continued)

(52) U.S. Cl.
CPC ............ *H05K 1/0271* (2013.01); *H05K 3/4602* (2013.01); *H01L 23/3128* (2013.01); *H01L 2224/131* (2013.01); *H01L 2224/16165* (2013.01); *H01L 2224/73253* (2013.01); *H01L 2924/15311* (2013.01); *H01L 2924/16251* (2013.01); *H01L 2924/3511* (2013.01); *H05K 1/0306* (2013.01); *H05K 3/4652* (2013.01); *H05K 2201/068* (2013.01); *H05K 2201/10378* (2013.01); *H05K 2201/10674* (2013.01); *H05K 2201/10734* (2013.01); *Y10T 428/31678* (2015.04)

(58) Field of Classification Search
None
See application file for complete search history.

(56) References Cited

U.S. PATENT DOCUMENTS 6,317,331 B1 * 11/2001 Kamath et al. ............... 361/760
6,548,179 B2 * 4/2003 Uhara et al. ............... 428/473.5

(Continued)

FOREIGN PATENT DOCUMENTS

| | | |
|---|---|---|
| EP | 1109428 A2 | 6/2001 |
| WO | WO-0011919 A1 | 3/2000 |

OTHER PUBLICATIONS

International Search Report and Written Opinion—PCT/US2014/037740—ISA/EPO—Aug. 14, 2014.

*Primary Examiner* — Humera Sheikh
*Assistant Examiner* — Seth Dumbris
(74) *Attorney, Agent, or Firm* — Loza & Loza, LLP

(57) ABSTRACT

Some novel features pertain to a substrate that includes a first core layer, a second core layer laterally located to the first core layer in the substrate, a first inorganic core layer (e.g., glass, silicon, ceramic) laterally positioned between the first core layer and the second core layer, the first inorganic core layer configured to be vertically aligned with a die configured to be coupled to the substrate, and a dielectric layer covering the first core layer, the second core layer and the first inorganic core layer. In some implementations, the first inorganic core layer has a first coefficient of thermal expansion (CTE), the die has a second coefficient of thermal expansion, and the first core layer has a third coefficient of thermal expansion (CTE). The first CTE of the first inorganic core layer closely matches the second CTE of the die in order to reduce the likelihood of warpage.

19 Claims, 14 Drawing Sheets

(51) Int. Cl.
*H01L 23/31* (2006.01)
*H05K 1/03* (2006.01)

(56) References Cited

U.S. PATENT DOCUMENTS

| | | |
|---|---|---|
| 7,091,589 B2 | 8/2006 | Mori et al. |
| 7,253,504 B1 * | 8/2007 | Zhai et al. ............... 257/668 |
| 7,730,613 B2 | 6/2010 | Vasoya |
| 7,893,527 B2 | 2/2011 | Shin et al. |
| 8,008,767 B2 | 8/2011 | Wada et al. |
| 8,143,110 B2 * | 3/2012 | Karpur et al. ............ 438/127 |
| 8,247,900 B2 | 8/2012 | Yuan |
| 2008/0096310 A1 | 4/2008 | Modi et al. |
| 2011/0156235 A1 * | 6/2011 | Yuan ....................... 257/690 |
| 2012/0133052 A1 * | 5/2012 | Kikuchi et al. ........... 257/774 |
| 2012/0153509 A1 * | 6/2012 | Kyozuka et al. ......... 257/784 |

* cited by examiner

US 9,155,191 B2

SUBSTRATE COMPRISING INORGANIC MATERIAL THAT LOWERS THE COEFFICIENT OF THERMAL EXPANSION (CTE) AND REDUCES WARPAGE

CLAIM OF PRIORITY/CLAIM OF BENEFIT

The present application claims priority to U.S. Provisional Application No. 61/829,928 titled "Substrate Comprising Inorganic Material That Lowers The Coefficient of Thermal Expansion (CTE) and Reduces Warpage", filed May 31, 2013, which is hereby expressly incorporated by reference herein.

BACKGROUND

1. Field

Various features relate to a substrate that includes inorganic material that lowers the coefficient of thermal expansion (CTE) and reduces warpage.

2. Background

A substrate is typically made of a central core layer and multiple dielectric layers on either side of the central core layer. Copper or other conductive material is used on the surface of the core and dielectric layers to route signals from the active component of an integrated circuit (IC)/die to the motherboard and other components in a device. The core layer includes a cured dielectric layer with metal (e.g., copper) foil bonded on both sides of the cured dielectric layer (e.g., resin). The buildup dielectric layer is often referred to as a prepreg (pre-impregnated) layer or buildup epoxy and may be laminated or pressed on top of the core during manufacturing.

FIG. 1 illustrates a die that is coupled (e.g., mounted) on a conventional substrate. Specifically, FIG. 1 illustrates a substrate 100 on which a die 102 is mounted. The substrate 100 is a package substrate. As shown in FIG. 1, the substrate 100 includes a core layer 104, a first dielectric layer 106, a first solder resist layer 110, a second solder resist layer 112, a first set of traces 114, a second set of traces 116, a first set of pads 120, a second set of pads 122, a first via 124, a second via 126, and a third via 128.

The substrate 100 also includes a first set of solder balls 130 and a second set of solder balls 132. The die 102 is coupled (e.g., mounted) to the substrate 100 through the first set of solder balls 130. The second set of solder balls 132 is configured to be coupled to a printed circuit board (PCB).

One major issue and concern that manufacturers of substrates face is the warpage of the substrate during IC/die/chip and/or board mount, which can lead to surface mount yield issues. These high temperature warpage problems are related to material properties including the coefficient of thermal expansion (CTE) of the materials comprising the substrate. In essence, the IC/die (that is mounted on a substrate) is made of material that typically has a CTE that is substantially different than the CTE of the substrate. Typically, the substrate has a CTE that is greater than the CTE of the IC/die. This is because the substrate includes more metal material than the IC/die. The metal material (e.g., copper) has a CTE that is much greater than the material of the IC/die. The difference in the CTEs of the IC and the substrate is was causes the warpage issue during the IC/die mounting on the substrate, as the IC will expand and contract differently than the substrate. In FIG. 1 the core layer 104 has a CTE that is different than the CTE of the die 102. This difference in CTE may cause warpage issue and thus result in a defective die package.

Therefore there is need for a substrate that has a CTE that is closer to the CTE of the IC/die, in order to reduce warpage issues during the mounting of the IC/die on the substrate and thus increasing the surface mount yield of dies that are mounted on a substrate.

SUMMARY

Various features relate to a substrate that includes inorganic material that lowers the coefficient of thermal expansion (CTE) and reduces warpage.

A first example provides a substrate that includes a first core layer, a second core layer, a first inorganic core layer and a dielectric layer. The first core layer includes a first Young's Modulus. The second core layer is laterally located to the first core layer in the substrate. The first inorganic core layer is laterally positioned between the first core layer and the second core layer. The first inorganic core layer includes a second Young's Modulus that is greater than the first Young's Modulus. The dielectric layer covers the first core layer, the second core layer and the first inorganic core layer.

According to an aspect, the first inorganic core layer is configured to be vertically aligned with a die configured to be coupled to the substrate.

According to one aspect, the first inorganic core layer has a first coefficient of thermal expansion (CTE), the die has a second coefficient of thermal expansion, and the first core layer has a third coefficient of thermal expansion (CTE), wherein the second CTE of the die is closer to the first CTE of the first inorganic core layer than the third CTE of the first core layer. In some implementations, the first CTE of the first inorganic core layer closely matches the second CTE of the die in order to reduce the likelihood of warpage.

According to an aspect, the second Young's Modulus is at least 1.35 times greater than the first Young's Modulus. In some implementations, the second Young's Modulus is at least 1.5 times greater than the first Young's Modulus. In some implementations, the second Young's Modulus is at least 50 gigapascals (GPa).

According to one aspect, the first inorganic core layer is one of at least glass, silicon and/or ceramic.

According to an aspect, the substrate further includes a second inorganic core layer laterally positioned between the first core layer and the second core layer, the first and second inorganic core layers are configured to be vertically aligned with the die configured to be coupled to the substrate.

According to one aspect, the substrate further includes at least one via that traverses through the first inorganic core layer.

According to an aspect, the substrate is a package substrate.

According to one aspect, the die is configured to be coupled to one of at least a mold or a stiffener attachment.

According to an aspect, the substrate further includes a buildup layer.

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a first core layer, a second core layer, a means for reducing warpage when a die is coupled to the apparatus, and a dielectric layer. The first core layer includes a first Young's Modulus. The second core layer is laterally located to the first core layer in the apparatus. The means for reducing warpage is laterally positioned between the first core layer and the second core layer. The means for reducing warpage includes a second Young's Modulus that is greater than the first Young's Modulus. The dielectric layer covers the first core layer, the second core layer and the means for reducing warpage.

According to an aspect, the means for reducing warpage is configured to be vertically aligned with the die configured to be coupled to the apparatus.

According to one aspect, the means for reducing warpage has a first coefficient of thermal expansion (CTE), the die has a second coefficient of thermal expansion, and the first core layer has a third coefficient of thermal expansion (CTE), wherein the second CTE of the die is closer to the first CTE of the means for reducing warpage than the third CTE of the first core layer. In some implementations, the first CTE of the means for reducing warpage closely matches the second CTE of the die in order to reduce the likelihood of warpage.

According to an aspect, the second Young's Modulus is at least 1.35 times greater than the first Young's Modulus. In some implementations, the second Young's Modulus is at least 1.5 times greater than the first Young's Modulus. In some implementations, the second Young's Modulus is at least 50 gigapascals (GPa).

According to one aspect, the means for reducing warpage is one of at least glass, silicon and/or ceramic.

According to an aspect, the means for reducing warpage includes a first inorganic core layer and a second inorganic core layer. The first and second core layers are laterally positioned between the first core layer and the second core layer. The first and second inorganic core layers are configured to be vertically aligned with the die configured to be coupled to the apparatus.

According to one aspect, the apparatus further includes at least one via that traverses through the means for reducing warpage.

According to an aspect, the apparatus is a package substrate.

According to one aspect, the die is configured to be coupled to one of at least a mold or a stiffener attachment.

According to an aspect, the apparatus further includes a buildup layer.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing a substrate. The method provides a first core layer that includes a first Young's Modulus. The method provides a second core layer laterally located to the first core layer in the substrate. The method provides a first inorganic core layer laterally positioned between the first core layer and the second core layer. The first inorganic core layer includes a second Young's Modulus that is greater than the first Young Modulus. The method provides a dielectric layer covering the first core layer, the second core layer and the first inorganic core layer.

According to an aspect, the first inorganic core layer is configured to be vertically aligned with a die configured to be coupled to the substrate.

According to one aspect, the first inorganic core layer has a first coefficient of thermal expansion (CTE), the die has a second coefficient of thermal expansion, and the first core layer has a third coefficient of thermal expansion (CTE), wherein the second CTE of the die is closer to the first CTE of the first inorganic core layer than the third CTE of the first core layer. In some implementations, the first CTE of the first inorganic core layer closely matches the second CTE of the die in order to reduce the likelihood of warpage.

According to an aspect, the second Young's Modulus is at least 1.35 times greater than the first Young's Modulus. In some implementations, the second Young's Modulus is at least 1.5 times greater than the first Young's Modulus. In some implementations, the second Young's Modulus is at least 50 gigapascals (GPa).

According to one aspect, the first inorganic core layer is one of at least glass, silicon and/or ceramic.

According to an aspect, the method further provides a second inorganic core layer laterally positioned between the first core layer and the second core layer. In some implementations, the first and second inorganic core layers are configured to be vertically aligned with the die configured to be coupled to the substrate.

According to one aspect, the method also provides at least one via that traverses through the first inorganic core layer.

According to an aspect, the substrate is a package substrate.

According to one aspect, the die is configured to be coupled to one of at least a mold or a stiffener attachment.

According to an aspect, the method further provides a buildup layer.

According to one aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a substrate that includes a first core layer, a second core layer, a first inorganic core layer and a dielectric layer. The second core layer is laterally located to the first core layer in the substrate. The first inorganic core layer (e.g., glass, silicon, ceramic) is laterally positioned between the first core layer and the second core layer. The dielectric layer covers the first core layer, the second core layer and the first inorganic core layer. In some implementations, the first core layer includes a first Young's Modulus. In some implementations, the first inorganic core layer includes a second Young's Modulus. In some implementations, the second Young's Modulus is at least 1.35 times greater than the first Young's Modulus. In some implementations, the second Young's Modulus is at least 1.5 times greater than the first Young's Modulus. In some implementations, the second Young's Modulus is at least 50 gigapascals (GPa). In some implementations, the first inorganic core layer is configured to be vertically aligned with a die configured to be coupled to the substrate. In some implementations, the first inorganic core layer has a first coefficient of thermal expansion (CTE), the die has a second coefficient of thermal expansion, and the first core layer has a third coefficient of thermal expansion (CTE). In some implementations, the second CTE of the die is closer to the first CTE of the first inorganic core layer than the third CTE of the first core layer. In some implementations, the first CTE of the first inorganic core layer closely matches the second CTE of the die in order to reduce the likelihood of warpage.

Exemplary Substrate Comprising Inorganic Material

Figure 1:
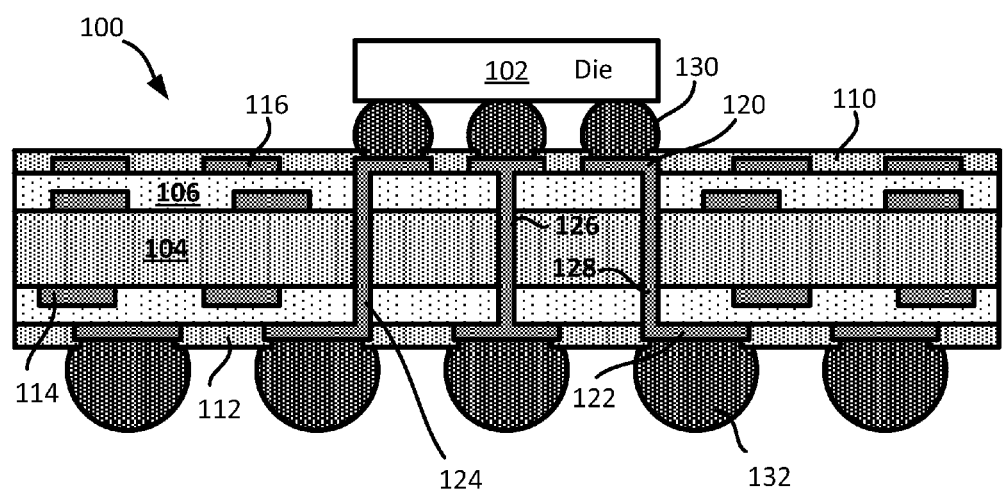
FIG. 1 illustrates a conventional substrate.
Figure 2:
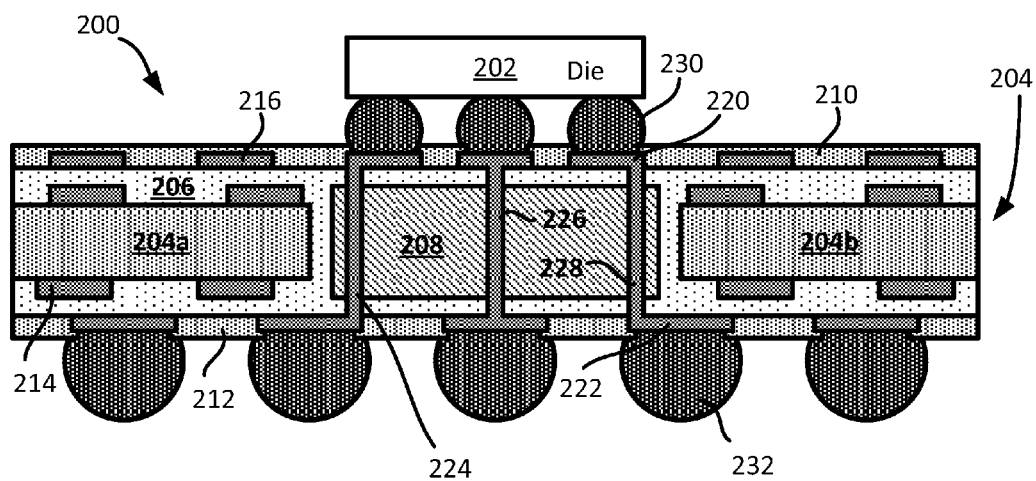
FIG. 2 illustrates an exemplary substrate that includes one inorganic core layer.

FIG. 2 illustrates an example of a substrate that includes one or more inorganic material that lowers the coefficient of thermal expansion (CTE) of the substrate and reduces warpage of the substrate. Specifically, FIG. 2 illustrates a substrate 200 on which a die 202 is mounted. The substrate 200 is a package substrate in some implementations. As shown in FIG. 2, the substrate 200 includes a core layer 204, a first dielectric layer 206, a first inorganic core layer 208, a first solder resist layer 210, a second solder resist layer 212, a first set of traces 214, a second set of traces 216, a first set of pads 220, a second set of pads 222, a first via 224, a second via 226, and a third via 228.

The core layer 204 may be a dielectric layer that is coated and/or impregnated with a resin/fiberglass/epoxy layer in some implementations. The core layer 204 may include a first core layer 204a and a second core layer 204b. The first core layer 204a may be positioned laterally to the second core layer 204b. The first inorganic core layer 208 is a material that has a coefficient of thermal expansion (CTE) that is near/close to the coefficient of thermal expansion (CTE) of the die 202. In some implementations, the CTE of the first inorganic core layer 208 is less than the effective CTE of the substrate. In some implementations, the CTE of the first inorganic core layer 208 is less than the CTE of the core layer 204. In some implementations, the CTE of the first inorganic core layer 208 is less than the CTE of the first dielectric layer 206. In some implementations, the first inorganic core layer 208 is glass. In some implementations, the first inorganic core layer 208 is a silicon. In some implementations, the first inorganic core layer 208 is a ceramic. However, different implementations may use different materials for the first inorganic core layer 208.

As shown in FIG. 2, the first inorganic core layer 208 is embedded in the substrate 200. Specifically, the first inorganic core layer 208 is in the substrate 200 and surrounded by the first dielectric layer 206. The first inorganic core layer 208 may be laterally located/positioned between the first core layer 204a and the second core layer 204b. In some implementations, the first inorganic core layer 208 may be configured to operate as a means for reducing warpage when a die is coupled to the substrate.

The substrate 200 also includes a first set of solder balls 230 and a second set of solder balls 232. The die 202 is coupled (e.g., mounted) to the substrate 200 through the first set of solder balls 230. The second set of solder balls 232 is configured to be coupled to a printed circuit board (PCB).

FIG. 2 also illustrates that the first via 224, the second via 226, and the third via 228 traverse through the first dielectric layer 206 and the first inorganic core layer 208. The first via 224, the second via 226, and the third via 228 are coupled to the first set of pads 220 and the second set of pads 222.

FIG. 2 further illustrates that the die 202 is coupled (e.g., mounted) on the substrate 200 such that the die 202 is vertically aligned with the first inorganic core layer 208. In some implementations, the first inorganic core layer 208 is configured (e.g., embedded in the substrate 200) to be vertically aligned (e.g., partially, substantially, completely) with the die 202 that is mounted on the substrate 200. Different implementations may couple the die 202 to the substrate 200 differently. For example, in some implementations, the die 202 may be partially, substantially, or completely vertically aligned with the first inorganic core layer 208. Since the die 202 and the first inorganic core layer 208 each have a CTE that is similar (e.g., close) to each other, they each both expand and contract in a similar fashion. As a result of having similar CTEs (e.g., similar lateral expansion and/or contraction properties), there is reduction in the likelihood of warpage when the die 202 is mounted on the substrate 200). The end result is an improved yield in the manufacturing and mounting of dies on substrates (e.g., package substrates).

FIG. 2 illustrates that the first inorganic core layer 208 has a size (e.g., width) that is substantially the same as the size (e.g., width) of the die 202. However, it should be noted that different implementations may use a first inorganic core layer 208 that has a different size than the size of the die 202. For example, the first inorganic core layer 208 may be bigger (e.g., wider) or smaller (e.g., narrower) than the die 202.

In some implementations, more than one inorganic core layer may be provided in the substrate.

Young's Modulus of Inorganic Core Layer and Core Layer

In some implementations, other material properties of the first inorganic core layer 208 may be different than the material properties of the core layer 204. For example, the stiffness of the first inorganic core layer 208 may be different than the stiffness of the core layer 204 (e.g., core layer 204a, core layer 204b). In some implementations, the stiffness of a material may be defined by a Young's Modulus (e.g., tensile modulus, elastic modulus). Different materials may have different Young's Modulus.

In some implementations, the core layer 204 (e.g., first core layer 204a, second core layer 204b) may include glass, resin, fiberglass, and/or epoxy. In some implementations, the core layer 204 may have a Young's Modulus between 20-37 gigapascals (GPa).

In some implementations, the first inorganic core layer 208 may be configured to have a Young's Modulus that is greater than a Young's Modulus for the core layer 204 (e.g., Young's Modulus for the first and second core layers 204a-204b). In some implementations, the first inorganic core layer 208 may have a Young's Modulus of at least 50 gigapascals (GPa). In some implementations, the first inorganic core layer 208 may be configured to have a Young's Modulus that is at least 1.35 times greater than a Young's Modulus for the core layer 204 (e.g., when the core layer 204 has a Young's Modulus of 37 GPa and the first inorganic core layer 208 has a Young's Modulus of 50 GPa). In some implementations, the first inorganic core layer 208 may be configured to have a Young's Modulus that is at least 1.5 times greater than a Young's Modulus for the core layer 204.

The glass core layer (e.g., core layer 208) may be different than the core layer 204 (e.g., first core layer 204a, second core layer 204b). In some implementations, the first inorganic core layer 208 may be a glass core layer that has a Young's modulus between 50-90 gigapascals (GPa). In some implementations, the glass core layer is a core layer that mostly includes glass (e.g., greater than 50 percent glass (by mass or volume)). In some implementations, the glass core layer is a core layer that is substantially pure glass (e.g., greater than 99% pure glass).

In some implementations, the first inorganic core layer 208 may be a silicon core layer that has a Young's Modulus between 130-185 gigapascals (GPa).

In some implementations, the first inorganic core layer 208 may be a ceramic core layer that has a Young's Modulus between 200-400 gigapascals (GPa).

In some implementations, a higher Young's Modulus means that the material is more flexible and more likely to bend than a material that has a lower Young's Modulus. For example, if material A has a Young's Modulus that is greater than a Young's Modulus for material B, then material A is said to be more flexible than material B.

In some implementations, providing core layers (e.g., first core layer 204a, second core layer 204b, inorganic core layer 208) with different Young's Modulus provides a substrate that is stiff enough to provide support for integrated circuits (ICs) and/or dies, while being flexible (or at least more flexible) in particular areas and/or portions (e.g., area underneath a die) so as to minimize and/or reduce the likelihood of cracking of the substrate.

Exemplary Substrate Comprising Multiple Inorganic Materials

Figure 3:
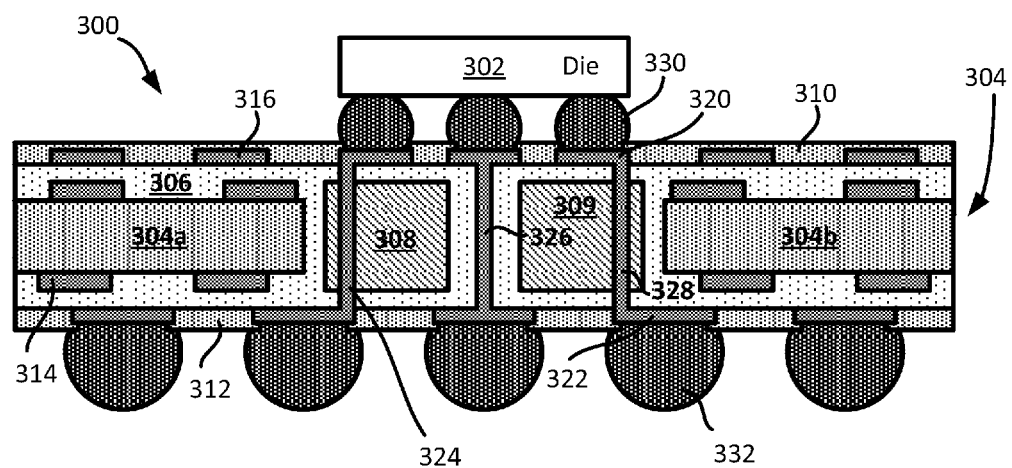
FIG. 3 illustrates an exemplary substrate that includes more than one inorganic core layer.

FIG. 3 illustrates an example of a substrate that includes several inorganic core layers. FIG. 3 is similar to FIG. 2, except that the substrate of FIG. 2 includes multiple inorganic core layers. Specifically, FIG. 3 illustrates a substrate 300 on which a die 302 is mounted. The substrate 300 is a package substrate in some implementations. As shown in FIG. 3, the substrate 300 includes a core layer 304, a first dielectric layer 306, a first inorganic core layer 308, a second inorganic core layer 309, a first solder resist layer 310, a second solder resist layer 312, a first set of traces 314, a second set of traces 316, a first set of pads 320, a second set of pads 322, a first via 324, a second via 326, and a third via 328.

The core layer 304 may be a dielectric layer that is coated and/or impregnated with a resin/fiberglass/epoxy layer in some implementations. The core layer 304 may include a first core layer 304a and a second core layer 304b. The first core layer 304a may be positioned laterally to the second core layer 304b. The first inorganic core layer 308 and the second inorganic core layer 209 are each made of a material that has a coefficient of thermal expansion (CTE) that is near/close to the coefficient of thermal expansion (CTE) of the die 302. In some implementations, the CTE of each of the first and inorganic core layers 308-309 is less than the effective CTE of the substrate. In some implementations, the CTE of each of the first and second inorganic core layers 308-309 is less than the CTE of the core layer 304. In some implementations, the CTE of each of the first and second inorganic core layers 308-309 is less than the CTE of the first dielectric layer 306. In some implementations, each of the first and second inorganic core layers 308-309 is glass. In some implementations, each of the first and second inorganic core layers 308-309 is silicon. In some implementations, each of the first and second inorganic core layers 308-309 is ceramic. In some implementations, the first inorganic core layer 308 may be glass and the second inorganic core layer 309 is silicon, or vice versa. However, different implementations may use different materials for the first and second inorganic core layers 308-309.

As shown in FIG. 3, the first and second inorganic core layers 308-309 are embedded in the substrate 300. Specifically, the first and second inorganic core layers 308-309 are in the substrate 300 and surrounded by the first dielectric layer 306. The first and second inorganic core layers 308-309 may be laterally located/positioned between the first core layer 304a and the second core layer 304b. In some implementations, the first inorganic core layer 308 may be configured to operate as a means for reducing warpage when a die is coupled to the substrate.

The substrate 300 also includes a first set of solder balls 330 and a second set of solder balls 332. The die 302 is coupled (e.g., mounted) to the substrate 300 through the first set of solder balls 330. The second set of solder balls 132 is configured to be coupled to a printed circuit board (PCB).

FIG. 3 also illustrates that the first via 324, the second via 326, and the third via 328 traverse through the first dielectric layer 306. The first via 324 also traverses the first inorganic core layer 308. The third via 328 also traverses the second inorganic core layer 309. The first via 324, the second via 326, and the third via 328 are coupled to the first set of pads 320 and the second set of pads 322.

FIG. 3 further illustrates that the die 302 is coupled (e.g., mounted) on the substrate 300 such that the die 302 is vertically aligned with the first and second inorganic core layers 308-309. In some implementations, the first and second inorganic core layers 308-309 are configured (e.g., embedded in the substrate 300) to be vertically aligned (e.g., partially, substantially, completely) with the die 302 that is mounted on the substrate 300. Different implementations may couple the die 302 to the substrate 300 differently. For example, in some implementations, the die 302 may be partially, substantially, or completely vertically aligned with the first and second inorganic core layers 308-309. Since the die 302 and the first and second inorganic core layers 308-309 each have a CTE that is similar (e.g., close) to each other, they each both expand and contract in a similar fashion. As a result of having similar CTEs (e.g., similar lateral expansion and/or contraction properties), there is reduction in the likelihood of warpage when the die 302 is mounted on the substrate 300). The end result is an improved yield in the manufacturing and mounting of dies on substrates (e.g., package substrates).

FIG. 3 illustrates two inorganic core layers. However, it should be noted that different implementations may use different number of inorganic core layers (e.g., more than two inorganic layers).

Young's Modulus of Inorganic Core Layer and Core Layer

In some implementations, other material properties of the first inorganic core layer 308 may be different than the material properties of the core layer 304. For example, the stiffness of the first inorganic core layer 308 and/or the second inorganic core layer 309 may be different than the stiffness of the core layer 304 (e.g., core layer 304a, core layer 304b). In some implementations, the stiffness of a material may be defined by a Young's Modulus (e.g., tensile modulus, elastic modulus). Different materials may have different Young's Modulus.

In some implementations, the core layer 304 (e.g., first core layer 304a, second core layer 304b) may include glass, resin, fiberglass, and/or epoxy. In some implementations, the core layer 304 may have a Young's Modulus between 20-37 gigapascals (GPa).

In some implementations, the first inorganic core layer 308 and/or the second inorganic core layer 309 may be configured to have a Young's Modulus that is greater than a Young's Modulus for the core layer 304 (e.g., Young's Modulus for the first and second core layers 304a-304b). In some implementations, the first inorganic core layer 308 and/or the second inorganic core layer 309 may have a Young's Modulus of at least 50 gigapascals (GPa). In some implementations, the first inorganic core layer 308 and/or the second inorganic core layer 309 may be configured to have a Young's Modulus that is at least 1.35 times greater than a Young's Modulus for the core layer 304 (e.g., when the core layer 304 has a Young's Modulus of 37 GPa and the first inorganic core layer 308 and/or the second inorganic core layer 309 has a Young's Modulus of 50 GPa). In some implementations, the first inorganic core layer 308 and/or the second inorganic core layer 309 may be configured to have a Young's Modulus that is at least 1.5 times greater than a Young's Modulus for the core layer 304.

The glass core layer(s) (e.g., first inorganic core layer 308, second inorganic core layer 309) may be different than the core layer 304 (e.g., first core layer 304a, second core layer 304b). In some implementations, the first inorganic core layer 308 and/or the second inorganic core layer 309 may be a glass core layer(s) that has a Young's modulus between 50-90 gigapascals (GPa). In some implementations, the glass core layer(s) (e.g., first and second inorganic core layer 308-309) is a core layer that mostly includes glass (e.g., greater than 50 percent glass (by mass or volume)). In some implementations, the glass core layer is a core layer that is substantially pure glass (e.g., greater than 99% pure glass).

In some implementations, the first inorganic core layer 308 and/or the second inorganic core layer 309 may be a silicon core layer that has a Young's Modulus between 130-185 gigapascals (GPa).

In some implementations, the first inorganic core layer 308 and/or the second inorganic core layer 309 may be a ceramic core layer that has a Young's Modulus between 200-400 gigapascals (GPa).

In some implementations, a higher Young's Modulus means that the material is more flexible and more likely to bend than a material that has a lower Young's Modulus. For example, if material A has a Young's Modulus that is greater than Young's Modulus for material B, then material A is said to be more flexible than material B.

In some implementations, providing core layers (e.g., first core layer 304a, second core layer 304b, first inorganic core layer 308, second inorganic core layer 309) with different Young's Modulus provides a substrate that is stiff enough to provide support for integrated circuits (ICs) and/or dies, while being flexible (or at least more flexible) in particular areas and/or portions (e.g., area underneath a die) so as to minimize and/or reduce the likelihood of cracking of the substrate.

Exemplary Substrate Comprising Inorganic Material and Mold

Figure 4:
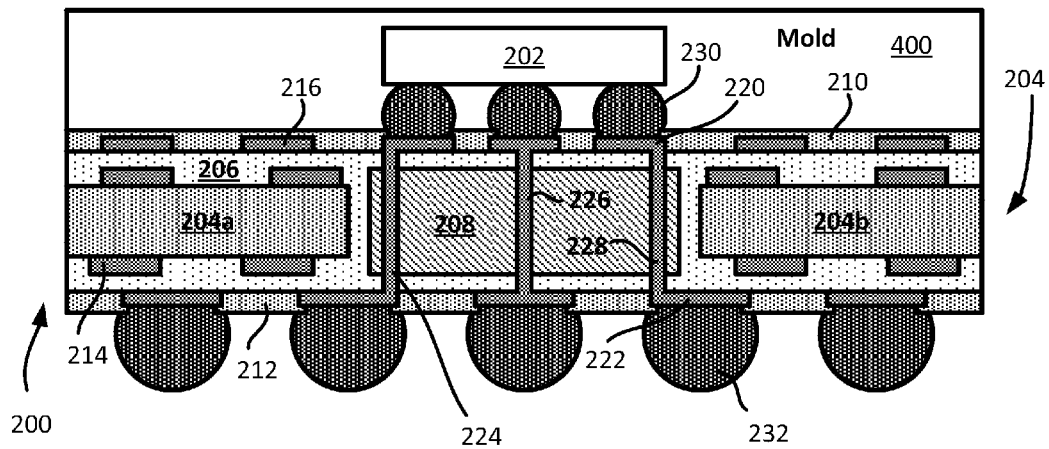
FIG. 4 illustrates an exemplary substrate that includes one inorganic core layer and a mold layer.
Figure 5:
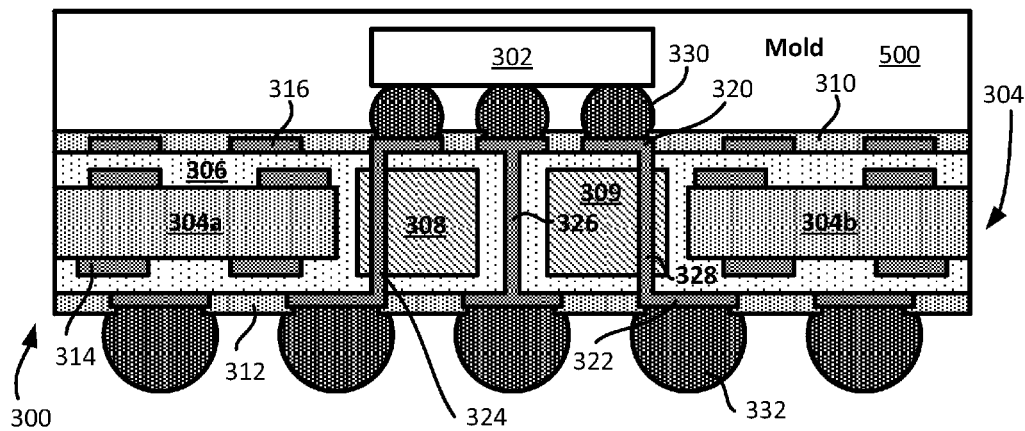
FIG. 5 illustrates an exemplary substrate that includes more than one inorganic core layer and a mold layer.

In some implementations, a substrate and an IC/die may be encapsulated with a mold. FIGS. 4-5 illustrate examples of an IC/die on a substrate and the IC/die is covered with a mold.

FIG. 4 illustrates an IC/die on substrate that includes an inorganic core layer, where the IC/die is covered with a mold/mold layer. Specifically, FIG. 4 illustrates a substrate 200 on which a die 202 is mounted. The substrate 200 is a package substrate in some implementations. As shown in FIG. 4, the substrate 200 includes a core layer 204, a first dielectric layer 206, a first inorganic core layer 208, a first solder resist layer 210, a second solder resist layer 212, a first set of traces 214, a second set of traces 216, a first set of pads 220, a second set of pads 222, a first via 224, a second via 226, and a third via 228. In some implementations, the core layer 204 includes a first core layer 204a and a second core layer 204b. In some implementations, the substrate 200 of FIG. 4 is similar and/or identical to the substrate 200 of FIG. 2.

In some implementations, the core layer 204 (e.g., first core layer 204a, second core layer 204b) may be a dielectric layer that is coated and/or impregnated with a resin/fiberglass/epoxy layer in some implementations. In some implementations, the core layer 204 (e.g., first core layer 204a, second core layer 204b) may include glass, resin, fiberglass, and/or epoxy. In some implementations, the inorganic core layer 208 may be one of glass, silicon and/or ceramic.

The substrate 200 also includes a first set of solder balls 230 and a second set of solder balls 232. The die 202 is coupled (e.g., mounted) to the substrate 200 through the first set of solder balls 230. The second set of solder balls 232 is configured to be coupled to a printed circuit board (PCB).

FIG. 4 also illustrates that the first via 224, the second via 226, and the third via 228 traverse through the first dielectric layer 206 and the first inorganic core layer 208. The first via 224, the second via 226, and the third via 228 are coupled to the first set of pads 220 and the second set of pads 222.

FIG. 4 also illustrates that the die 202 is covered with a mold/mold layer 400. In some implementations, the mold/mold layer 400 is configured to provide a protective layer for the die 202. The mold/mold layer 400 also covers the solder resist layer 210 and the first set of solder balls 230.

FIG. 5 illustrates another IC/die on substrate that includes several inorganic core layers, where the IC/die is covered with a mold/mold layer. Specifically, FIG. 5 illustrates a substrate 300 on which a die 302 is mounted. The substrate 300 is a package substrate in some implementations. As shown in FIG. 5, the substrate 300 includes a core layer 304, a first dielectric layer 306, a first inorganic core layer 308, a second inorganic core layer 309, a first solder resist layer 310, a second solder resist layer 312, a first set of traces 314, a second set of traces 316, a first set of pads 320, a second set of pads 322, a first via 324, a second via 326, and a third via 328. In some implementations, the core layer 304 includes a first core layer 304a and a second core layer 304b. In some implementations, the substrate 300 of FIG. 5 is similar and/or identical to the substrate 300 of FIG. 3.

In some implementations, the core layer 304 (e.g., first core layer 304a, second core layer 304b) may be a dielectric layer that is coated and/or impregnated with a resin/fiberglass/epoxy layer in some implementations. In some implementations, the core layer 304 (e.g., first core layer 304a, second core layer 304b) may include glass, resin, fiberglass, and/or epoxy. In some implementations, the first inorganic core layer 308 and/or second inorganic core layer 309 may be one of glass, silicon and/or ceramic.

As shown in FIG. 5, the first and second inorganic core layers 308-309 are embedded in the substrate 300. Specifically, the first and second inorganic core layers 308-309 are in the substrate 300 and surrounded by the first dielectric layer 306.

The substrate 300 also includes a first set of solder balls 330 and a second set of solder balls 332. The die 302 is coupled (e.g., mounted) to the substrate 300 through the first set of solder balls 330. The second set of solder balls 132 is configured to be coupled to a printed circuit board (PCB).

FIG. 5 also illustrates that the first via 324, the second via 326, and the third via 328 traverse through the first dielectric layer 306. The first via 324 also traverses the first inorganic core layer 308. The third via 328 also traverses the second inorganic core layer 309. The first via 324, the second via 326, and the third via 328 are coupled to the first set of pads 320 and the second set of pads 322.

FIG. 5 also illustrates that the die 302 is covered with a mold/mold layer 500. In some implementations, the mold/mold layer 500 is configured to provide a protective layer for the die 302. The mold/mold layer 500 also covers the solder resist layer 310 and the first set of solder balls 330.

Exemplary Substrate Comprising Inorganic Material and Attachment

Figure 6:
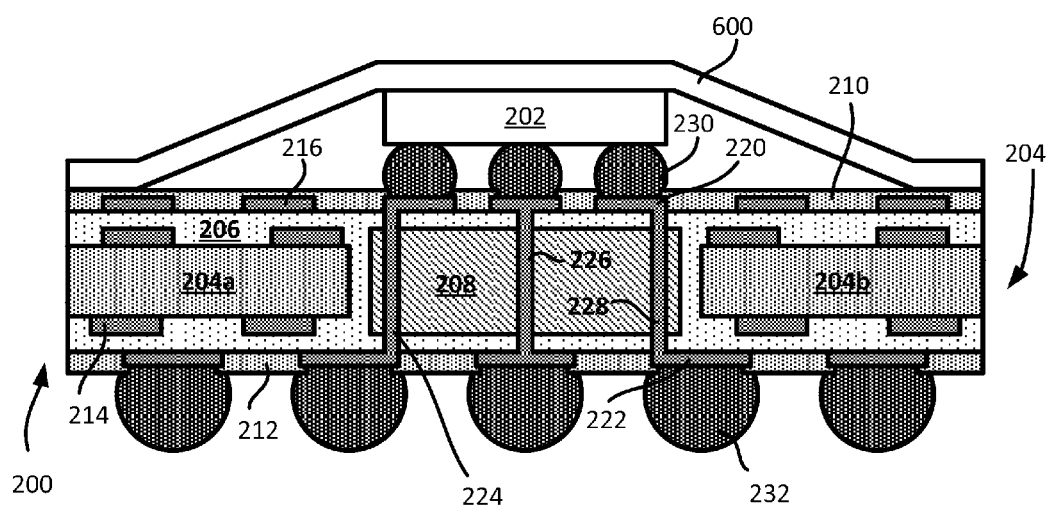
FIG. 6 illustrates an exemplary substrate that includes one inorganic core layer and an attachment.
Figure 7:
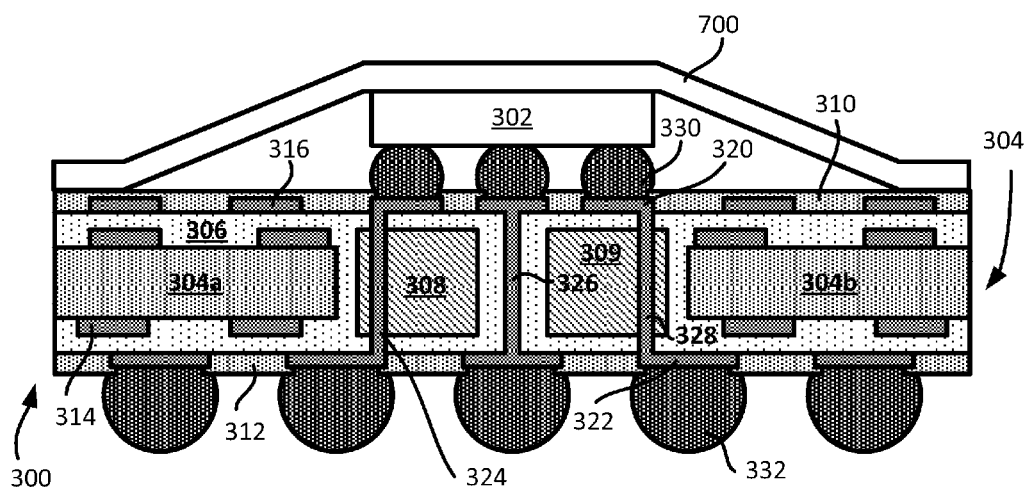
FIG. 7 illustrates an exemplary substrate that includes more than one inorganic core layer and an attachment.

In some implementations, a substrate and an IC/die coupled to an attachment. FIGS. 6-7 illustrate examples of an IC/die on a substrate and the IC/die is covered with an attachment. The attachment may be a stiffener attachment that is configured to provide structural support of the IC/die.

FIG. 6 illustrates an IC/die on substrate that includes an inorganic core layer, where the IC/die is coupled to an attachment (e.g., stiffener attachment). Specifically, FIG. 6 illustrates a substrate 200 on which a die 202 is mounted. The substrate 200 is a package substrate in some implementations. As shown in FIG. 6, the substrate 200 includes a core layer 204, a first dielectric layer 206, a first inorganic core layer 208, a first solder resist layer 210, a second solder resist layer 212, a first set of traces 214, a second set of traces 216, a first set of pads 220, a second set of pads 222, a first via 224, a second via 226, and a third via 228. In some implementations, the core layer 204 includes a first core layer 204a and a second core layer 204b. In some implementations, the substrate 200 of FIG. 6 is similar and/or identical to the substrate 200 of FIG. 2.

In some implementations, the core layer 204 (e.g., first core layer 204a, second core layer 204b) may be a dielectric layer that is coated and/or impregnated with a resin/fiberglass/epoxy layer in some implementations. In some implementations, the core layer 204 (e.g., first core layer 204a, second core layer 204b) may include glass, resin, fiberglass, and/or epoxy. In some implementations, the inorganic core layer 208 may be one of glass, silicon and/or ceramic.

The substrate 200 also includes a first set of solder balls 230 and a second set of solder balls 232. The die 202 is coupled (e.g., mounted) to the substrate 200 through the first set of solder balls 230. The second set of solder balls 232 is configured to be coupled to a printed circuit board (PCB).

FIG. 6 also illustrates that the first via 224, the second via 226, and the third via 228 traverse through the first dielectric layer 206 and the first inorganic core layer 208. The first via 224, the second via 226, and the third via 228 are coupled to the first set of pads 220 and the second set of pads 222.

FIG. 6 also illustrates that the die 202 is coupled to an attachment 600 (e.g., stiffener attachment). In some implementations, the attachment 600 is configured to provide structure/structural support for the die 202.

FIG. 7 illustrates another IC/die on substrate that includes several inorganic core layers, where the IC/die is coupled to attachment (e.g., stiffener attachment). Specifically, FIG. 7 illustrates a substrate 300 on which a die 302 is mounted. The substrate 300 is a package substrate in some implementations. As shown in FIG. 7, the substrate 300 includes a core layer 304, a first dielectric layer 306, a first inorganic core layer 308, a second inorganic core layer 309, a first solder resist layer 310, a second solder resist layer 312, a first set of traces 314, a second set of traces 316, a first set of pads 320, a second set of pads 322, a first via 324, a second via 326, and a third via 328. In some implementations, the core layer 304 includes a first core layer 304a and a second core layer 304b. In some implementations, the substrate 300 of FIG. 7 is similar and/or identical to the substrate 300 of FIG. 3.

In some implementations, the core layer 304 (e.g., first core layer 304a, second core layer 304b) may be a dielectric layer that is coated and/or impregnated with a resin/fiberglass/epoxy layer in some implementations. In some implementations, the core layer 304 (e.g., first core layer 304a, second core layer 304b) may include glass, resin, fiberglass, and/or epoxy. In some implementations, the first inorganic core layer 308 and/or second inorganic core layer 309 may be one of glass, silicon and/or ceramic.

As shown in FIG. 7, the first and second inorganic core layers 308-309 are embedded in the substrate 300. Specifically, the first and second inorganic core layers 308-309 are in the substrate 300 and surrounded by the first dielectric layer 306.

The substrate 300 also includes a first set of solder balls 330 and a second set of solder balls 332. The die 302 is coupled (e.g., mounted) to the substrate 300 through the first set of solder balls 330. The second set of solder balls 132 is configured to be coupled to a printed circuit board (PCB).

FIG. 7 also illustrates that the first via 324, the second via 326, and the third via 328 traverse through the first dielectric layer 306. The first via 324 also traverses the first inorganic core layer 308. The third via 328 also traverses the second inorganic core layer 309. The first via 324, the second via 326, and the third via 328 are coupled to the first set of pads 320 and the second set of pads 322.

FIG. 7 also illustrates that the die 302 is coupled to an attachment 700 (e.g., stiffener attachment). In some implementations, the attachment 700 is configured to provide structure/structural support for the die 302.

Having described several substrates with inorganic core layers, a sequence for providing/manufacturing a substrate that includes one or more inorganic core layers will now be described.

Exemplary Sequence for Providing/Manufacturing a Substrate that Includes an Inorganic Core Layer FIGS. 8A-8E illustrate an exemplary sequence for providing/manufacturing a substrate (e.g., package substrate) that includes one or more inorganic core layer. It should be noted that for the purpose of clarity and simplification, the sequence of FIGS. 8A-8E do not necessarily include all the steps and/or stages of providing/manufacturing a substrate that includes one or more inorganic core layers. Moreover, in some instances, several steps and/or stages may have been combined into a single step and/or stage in order to simplify the description of the sequences.

Figure 8A:
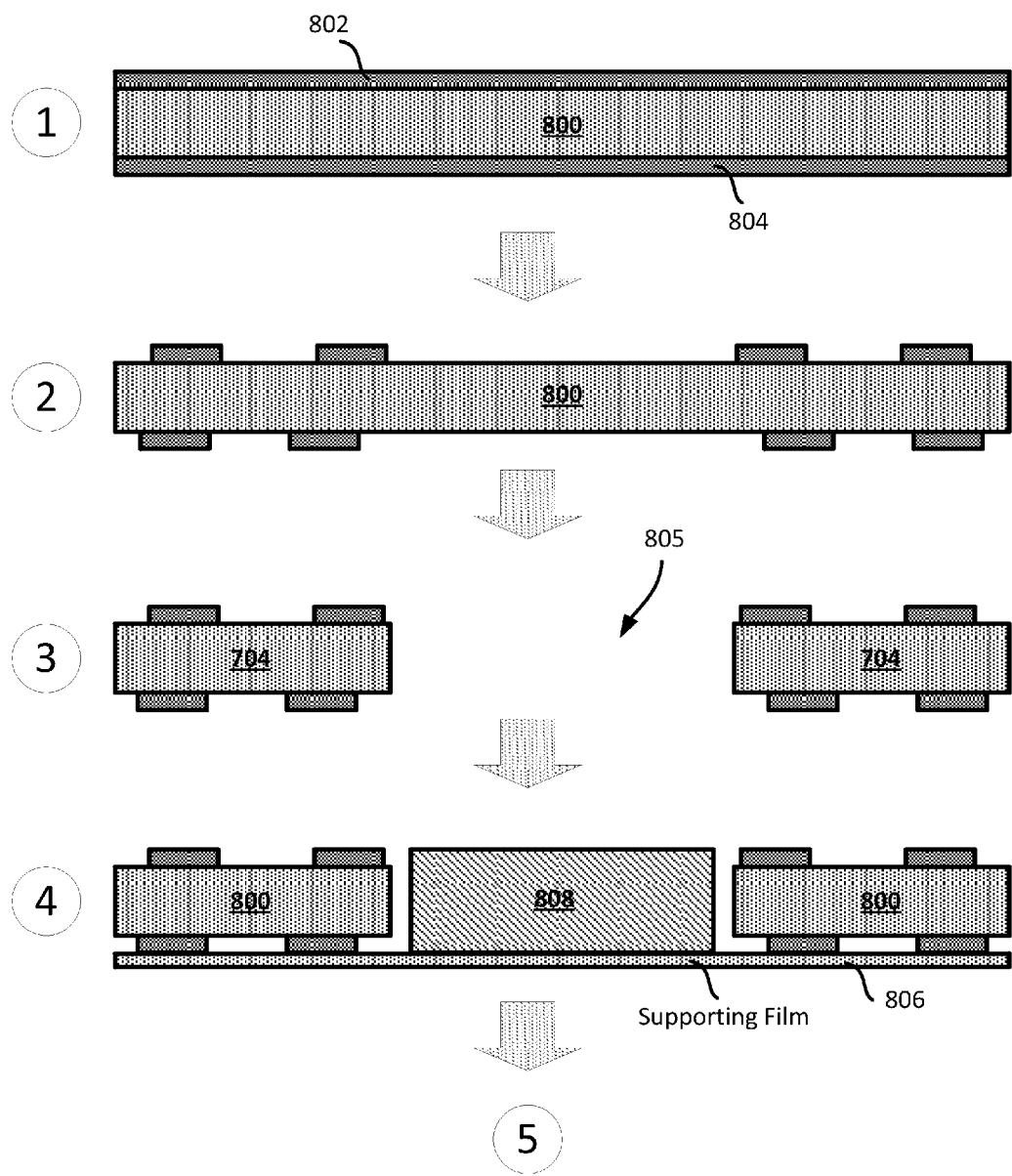
FIGS. 8A-8E illustrate an exemplary sequence of providing/manufacturing a substrate (e.g., package substrate) that includes one or more inorganic core layer.

As shown in FIG. 8A, a core layer 800 is provided (at stage 1). The core layer 804 may includes a first metal layer 802 and a second metal layer 804. The core layer 800 may be a dielectric layer in some implementations. The first metal layer 802 and the second metal layer 804 may be a copper layer in some implementations.

The first and second metal layers 802 & 804 may be etched (at stage 2) to selectively remove some of the metal on the core layer 800. Different implementations may use different processes to etch the first and second metal layers 802 & 804. In some implementations, the remaining metal defines one or more traces (e.g., copper traces) on core layer 800.

A cavity 805 (e.g., hole) is created (at stage 3) in the core layer 800. Different implementations may use difference processes to create the cavity 805. In some implementations, the cavity 805 is created by using a laser to drill a cavity (e.g., hole) in the core layer 800.

The core layer 800 is then coupled (at stage 4) to a supporting film 806. In some implementations, the supporting film 806 provides a temporary base for the core layer 800. An inorganic core layer 808 is also provided (at stage 4) in the cavity 805. In some implementations, the inorganic core layer 808 is resting on the supporting film 806. In some implementations, several inorganic core layers (e.g., two or more inorganic core layers) may be provided in the cavity 805. Different implementations may use different materials for the inorganic core layer. In some implementations, the inorganic core layer 808 may be one of glass, silicon and/or ceramic. In some implementations, the inorganic core layer 808 may be configured to operate as a means for reducing warpage when a die is coupled to the substrate.

Figure 8B:
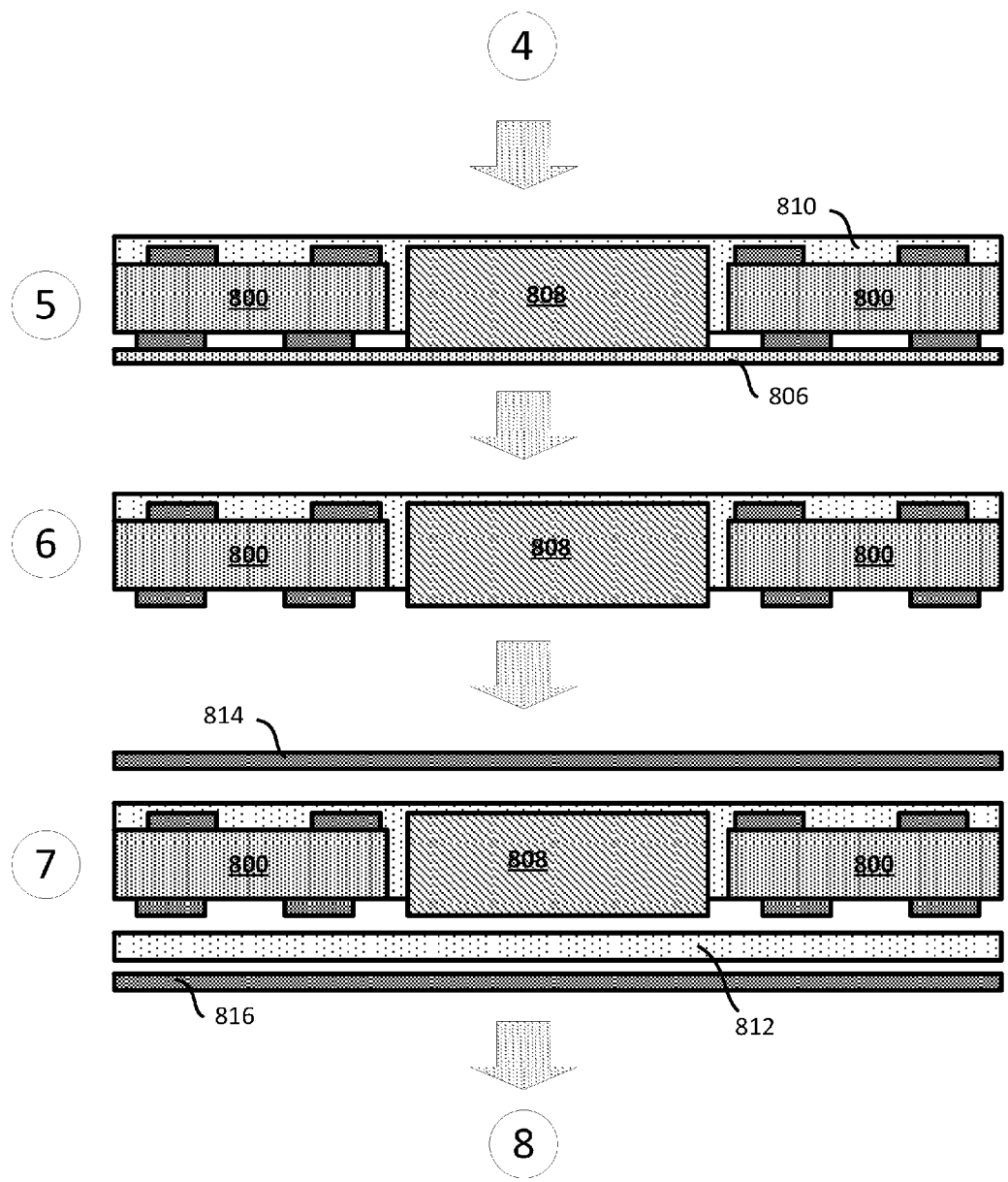

As shown in FIG. 8B, a first dielectric layer 810 is provided (at stage 5) on a top portion of the core layer 800 and the inorganic core layer 808. Once the first dielectric layer 810 is provided (at stage 5), the supporting film 806 is removed (at stage 6).

A second dielectric layer 812 is provided (at stage 7) on a bottom portion of the core layer 800 and the inorganic core layer 808. A third metal layer 814 and a fourth metal layer 816 are also provided (at stage 7). The third and fourth metal layers 814 & 816 may be a copper layer in some implementations. In some implementations, one or more buildup layers may be provided (at stage 7). In some implementations, a buildup layer may include a dielectric layer and a metal layer. The metal layer of the buildup layer may be selectively etched to define one or more traces in the buildup layer.

Figure 8C:
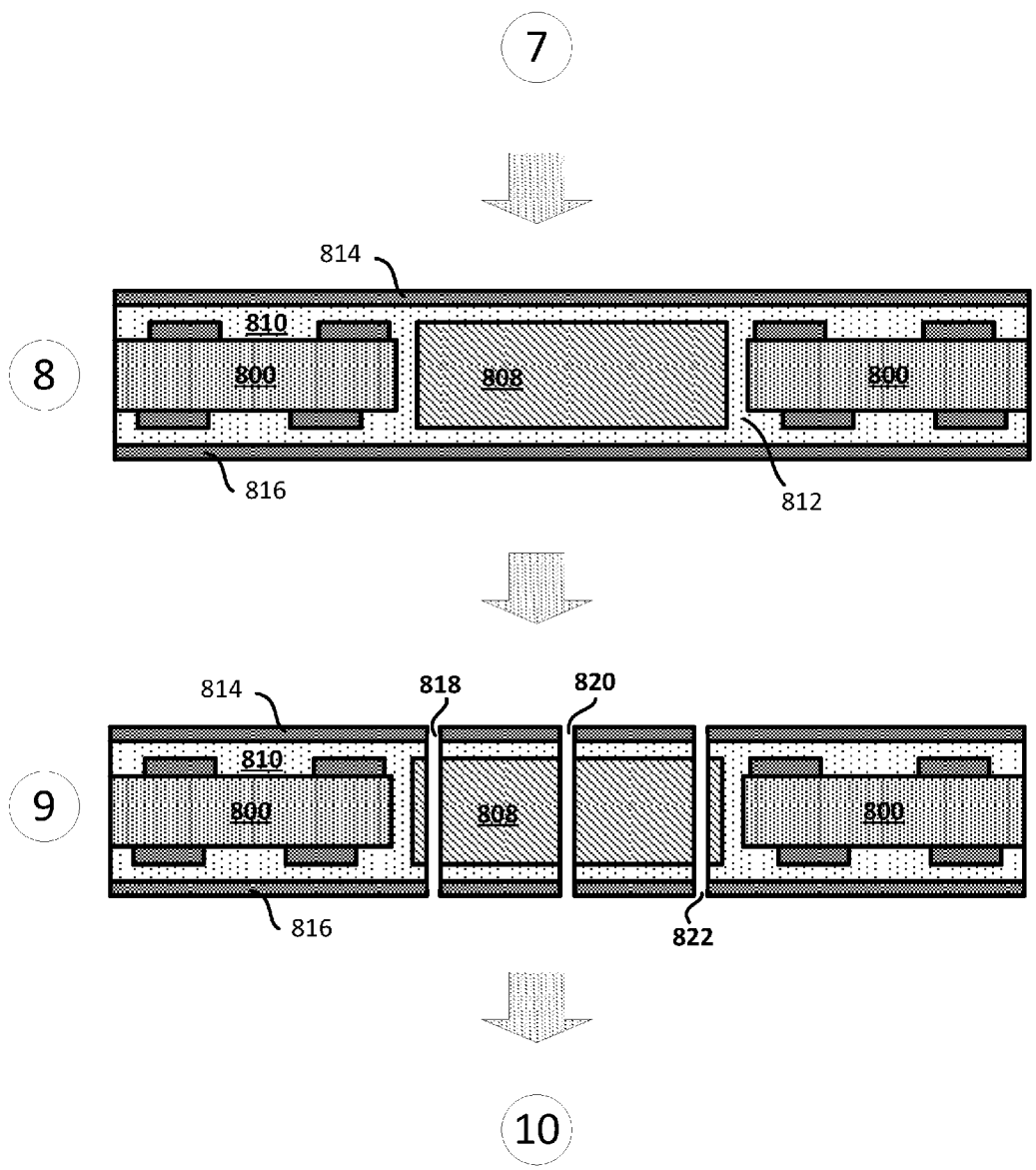

As shown in FIG. 8C, stage 8 illustrates a substrate once the second dielectric layer 812, the third metal layer 814 and the fourth metal layer 816 are coupled to the core layer 800, the inorganic core layer 808 and the first dielectric layer 810. As shown at stage 8, in some implementations, the first and second dielectric layer 810 & 812 may be blended without a boundary line. In some implementations, after assembly, the first and second dielectric layers 810 & 812 may be collectively referred to as the first dielectric layer 810. In some implementations, the second dielectric layer 812 is the same dielectric as the first dielectric layer 810.

One or more via cavities (e.g., first via cavity 818, second via cavity 820, third via cavity 822) are created (at stage 9) in the substrate. More specifically, one or more via cavities that traverse the first dielectric layer 810 and the inorganic core layer 808 are created. In some implementations, a laser may be used to create the via cavities that traverse the first dielectric layer 810 and the inorganic core layer 808.

Figure 8D:
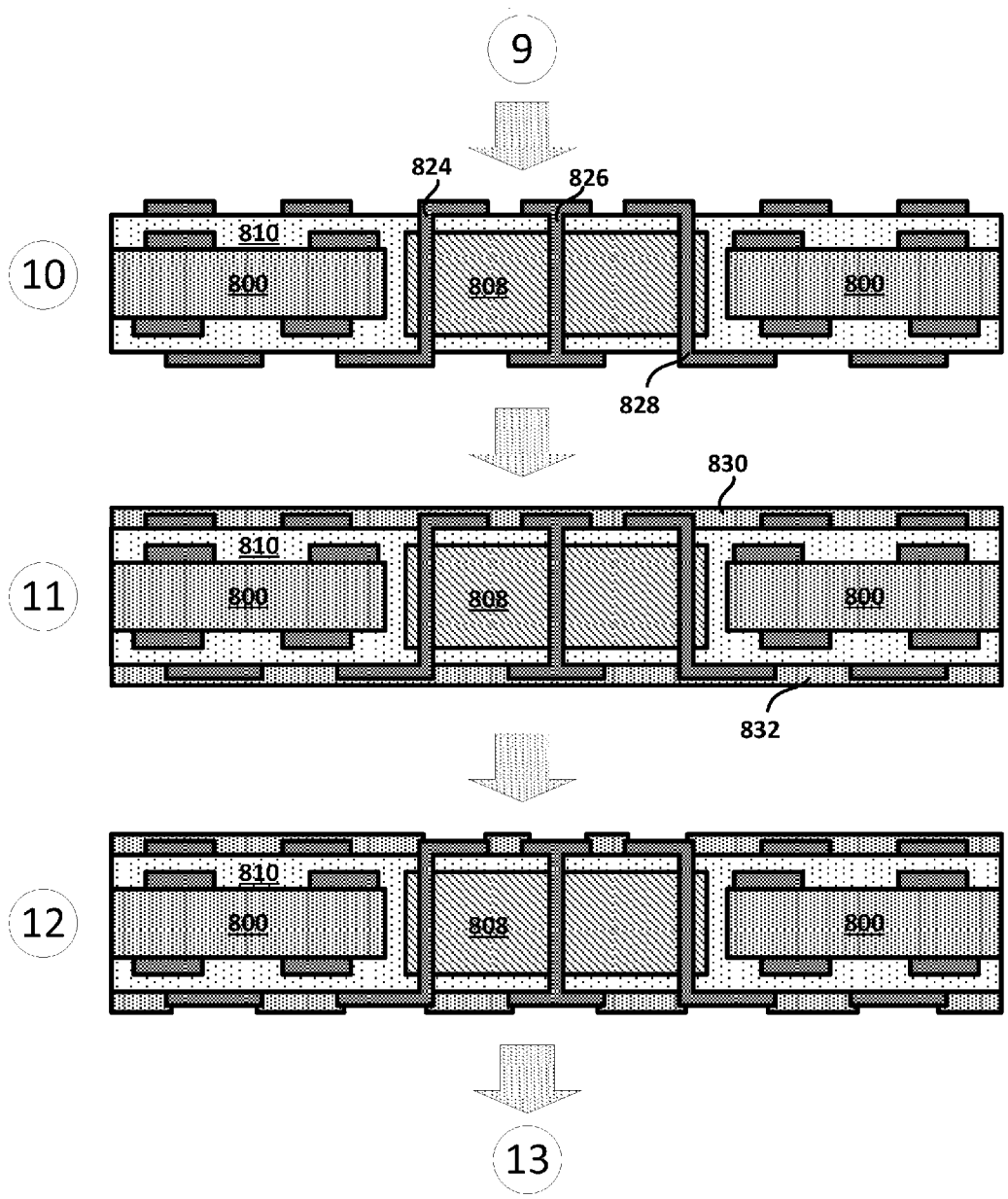

As shown in FIG. 8D, the third and fourth metal layers 814 & 816 are selectively etched (at stage 10) to define one or more traces and/or pads on the substrate. Different implementations may use different processes to selectively etch the third and fourth metal layers 814 & 816. In addition, the via cavities (e.g., first via cavity 818, second via cavity 820, third via cavity 822) are filled (at stage 10) with a metal (e.g., copper, copper paste) which define the vias (e.g., first via 824, second via 826, third via 828) in the substrate. As shown at stage 10, the vias traverse through the inorganic core layer 808. In some implementations, the vias cavities (e.g., first via cavity 818, second via cavity 820, third via cavity 822) may be filled at the same time as the third and fourth metal layers 814 and 816 are selectively etched to define one or more traces and/or pads on the substrate.

A first solder resist layer 830 and a second solder resist layer 832 are provided (at stage 11). Next, the solder resist layer 830 and the second solder resist layer 832 are selectively etched (at stage 12) to expose one or more pads. In some implementations, stage 11 and stage 12 may be referred to as back end processing.

Figure 8E:
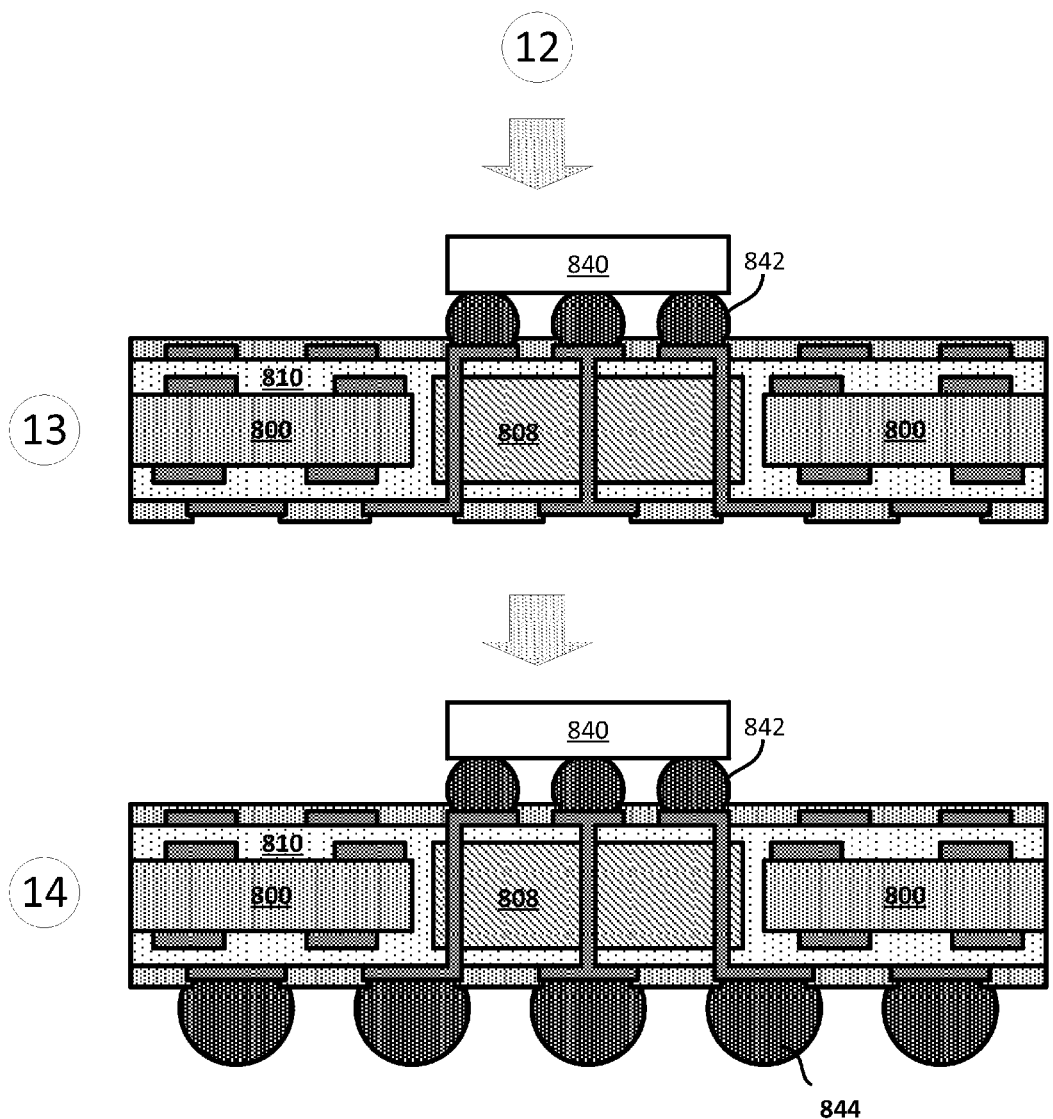

As shown in FIG. 8E, a die 840 is coupled (at stage 13) to the substrate through a first set of solder balls 842. A second set of solder balls 844 is also coupled (at stage 14) to the substrate.

In some implementations, a mold/mold layer (not shown) may be coupled to the die 840 and the substrate. In some implementations, an attachment (e.g., stiffener attachment) may be coupled to the die 840.

Having described an exemplary sequence for providing/manufacturing a substrate (e.g., package substrate) that includes one or more inorganic core layer, a flow diagram of an exemplary method for providing/manufacturing a substrate (e.g., package substrate) that includes one or more inorganic core layer will now be described below.

Figure 9:
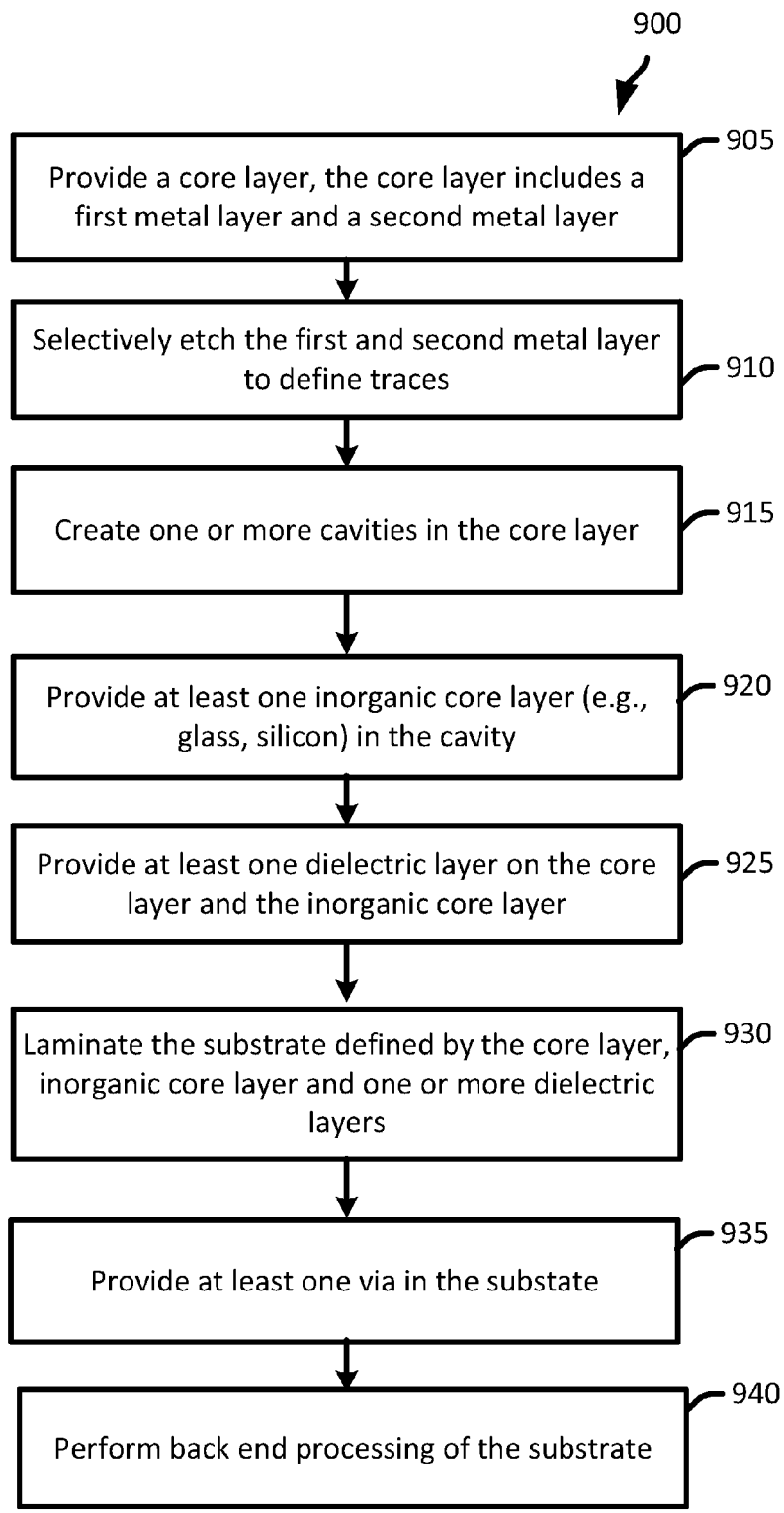
FIG. 9 illustrates an exemplary flow diagram of a method for providing/manufacturing a substrate that includes one or more inorganic core layer.

Exemplary Flow Diagram of a Method for Providing/Manufacturing a Substrate that Includes an Inorganic Core Layer FIG. 9 illustrates an exemplary flow diagram of a method for providing/manufacturing a substrate (e.g., package substrate) that includes one or more inorganic core layer. It should be noted that for the purpose of clarity and simplification, the flow diagram of FIG. 9 does not necessarily include all the steps of providing/manufacturing a substrate that includes one or more inorganic core layers. Moreover, in some instances, several steps may have been combined into a single step in order to simplify the description of the sequences.

As shown in FIG. 9, the method provides (at step 905) a core layer. The core layer (e.g., core layer 800) may include a first metal layer and a second metal layer. The core layer may be a dielectric layer in some implementations. The first metal layer and the second metal layer may be a copper layer in some implementations.

The method then selectively etches (at step 910) the first and second metal layers to selectively remove some of the metal on the core layer. Different implementations may use different processes to selectively etch the first and second metal layers. In some implementations, the remaining metal on the core layer defines one or more traces (e.g., copper traces) on core layer.

Next, the method creates (at 915) one or more cavities (e.g., cavity 805) in the core layer. Different implementations may use difference processes to create the cavity. In some implementations, the cavity is created by using a laser to drill a cavity (e.g., hole) in the core layer.

The method then provides (at 920) at least one inorganic core layer in the cavity of the core layer. In some implementations, the at least one inorganic core layer is one of at least glass, silicon and/or ceramic. In some implementations, the at least one inorganic core layer may be configured to operate as a means for reducing warpage when a die is coupled to the substrate. In some implementations, providing (at 920) the at least one inorganic core layer includes coupling the core layer to a supporting film and providing the at least one inorganic core layer in the cavity above the supporting film. In some implementations, the supporting film provides a temporary base for the core layer.

The method provides (at 925) at least one dielectric layer on the core layer and the inorganic core layer. In some implementations, providing at least one dielectric layer couples the inorganic core layer and the core layer. In some implementations, providing the at least one dielectric layer includes providing a first dielectric layer above the core layer and the inorganic core layer and a second dielectric layer below the core layer and the inorganic core layer. The second dielectric layer may be provided after the supporting film is removed in some implementations.

The method laminates (at 930) the substrate. In some implementations, laminating the substrate includes providing a third metal layer and a fourth metal layer on the substrate. Specifically, providing the third metal layer includes providing the third metal layer above the dielectric layer (e.g., first dielectric layer) and providing the fourth metal layer includes providing the fourth metal layer below the dielectric layer (e.g., second dielectric layer). In some implementations, one or more buildup layers may be provided (at or before 930). In some implementations, a buildup layer may include a dielectric layer and a metal layer. The metal layer of the buildup layer may be selectively etched to define one or more traces in the buildup layer.

The method provides (at 935) vias in the substrate, and traces and/or pads on the substrate. In some implementations, providing the vias includes drilling one or more via cavities in the substrate and filling the via cavities with metal (e.g., copper, copper paste). In some implementations, the vias traverse the dielectric layer and/or the inorganic core layer. However, different implementations may provide the vias differently. In some implementations, providing the traces and/or pads on the substrate includes selectively etching the third and fourth metal layers to define the traces and/or pads.

The method further performs (at 940) back end processing of the substrate. In some implementations, performing (at 940) back end processing of the substrate includes providing a first solder resist layer and a second solder resist layer. In some implementations, performing back end processing further includes selectively etching the first and second solder resist layers to expose the traces and/or pads on the substrate.

Once the back end processing is complete, a die may be coupled to the substrate that includes one or more inorganic core layer in some implementations. In addition, a mold/mold layer be coupled to the die and/or the substrate in some implementations. Moreover, in some implementations, an attachment (e.g., stiffener attachment) may be coupled to the die.

Figure 10:
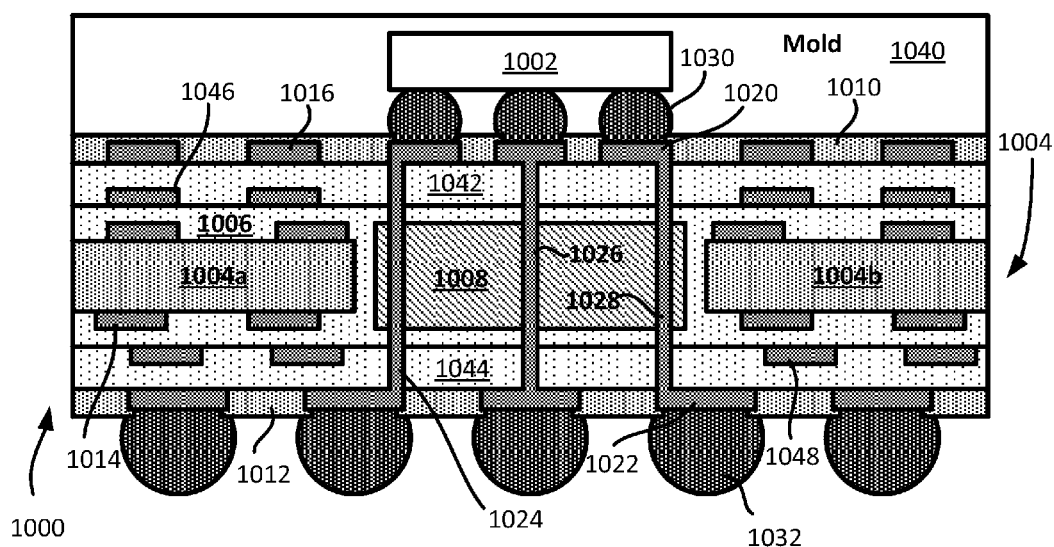
FIG. 10 illustrates an exemplary substrate that includes several dielectric layers, one inorganic core layer and a mold layer.
Figure 11:
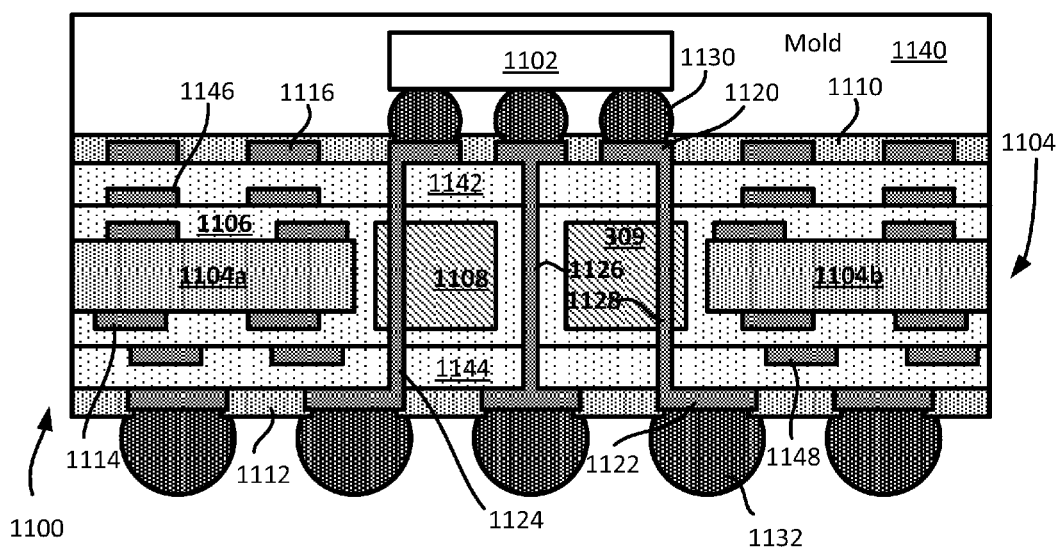
FIG. 11 illustrates an exemplary substrate that includes several dielectric layers, more than one inorganic core layer and a mold layer.

Exemplary Substrate Comprising Inorganic Material, Several Dielectric Layers and Mold In some implementations, a substrate may include several dielectric layers (e.g., one or more buildup layers) and an IC/die that may be encapsulated with a mold. FIGS. 10-11 illustrate examples of an IC/die on a substrate and the IC/die is covered with a mold.

FIG. 10 illustrates an IC/die on a substrate that includes several dielectric layers (e.g., one or more buildup layers) and an inorganic core layer, where the IC/die is covered with a mold/mold layer. Specifically, FIG. 4 illustrates a substrate 1000 on which a die 1002 is mounted. The substrate 1000 is a package substrate in some implementations. As shown in FIG. 10, the substrate 1000 includes a core layer 1004, a first dielectric layer 1006, a first inorganic core layer 1008, a first solder resist layer 1010, a second solder resist layer 1012, a first set of traces 1014, a second set of traces 1016, a first set of pads 1020, a second set of pads 1022, a first via 1024, a second via 1026, and a third via 1028.

In some implementations, the core layer 1004 includes a first core layer 1004a, and a second core layer 1004b. In some implementations, the core layer 1004 (e.g., first core layer 1004a, second core layer 1004b) may be a dielectric layer that is coated and/or impregnated with a resin/fiberglass/epoxy layer in some implementations. In some implementations, the core layer 1004 (e.g., first core layer 1004a, second core layer 1004b) may include glass, resin, fiberglass, and/or epoxy. In some implementations, the inorganic core layer 1008 may be one of glass, silicon and/or ceramic.

The substrate 1000 also includes a first set of solder balls 1030 and a second set of solder balls 1032. The die 1002 is coupled (e.g., mounted) to the substrate 1000 through the first set of solder balls 1030. The second set of solder balls 1032 is configured to be coupled to a printed circuit board (PCB).

FIG. 10 also illustrates that the first via 1024, the second via 1026, and the third via 1028 traverse through the first dielectric layer 1006 and the first inorganic core layer 1008. The first via 1024, the second via 1026, and the third via 1028 are coupled to the first set of pads 1020 and the second set of pads 1022.

FIG. 10 also illustrates that the die 1002 is covered with a mold/mold layer 400. In some implementations, the mold/mold layer 1040 is configured to provide a protective layer for the die 1002. The mold/mold layer 1040 also covers the solder resist layer 1010 and the first set of solder balls 1030.

FIG. 10 further illustrates that the substrate 1000 includes several buildup layers. Specifically, FIG. 10 illustrates that the substrate 1000 includes a first buildup layer 1042 and a second buildup layer 1044. The first and second buildup layers 1042 & 1044 include a dielectric layer. The first buildup layer 1042 also includes a set of trace 1046. The second buildup layer 1044 includes a set of traces 1048. In some implementations, additional buildup layers may be provided on the substrate 1000.

FIG. 11 illustrates another IC/die on substrate that includes several inorganic core layers, where the IC/die is covered with a mold/mold layer. Specifically, FIG. 11 illustrates a substrate 1100 on which a die 1102 is mounted. The substrate 1100 is a package substrate in some implementations. As shown in FIG. 11, the substrate 1100 includes a core layer 1104, a first dielectric layer 1106, a first inorganic core layer 1108, a second inorganic core layer 1109, a first solder resist layer 1110, a second solder resist layer 1112, a first set of traces 1114, a second set of traces 1116, a first set of pads 1120, a second set of pads 1122, a first via 1124, a second via 1126, and a third via 1128.

In some implementations, the core layer 1104 includes a first core layer 1104a, and a second core layer 1104b. In some implementations, the core layer 1104 (e.g., first core layer 1104a, second core layer 1104b) may be a dielectric layer that is coated and/or impregnated with a resin/fiberglass/epoxy layer in some implementations. In some implementations, the core layer 1104 (e.g., first core layer 1104a, second core layer 1104b) may include glass, resin, fiberglass, and/or epoxy. In some implementations, the first inorganic core layer 1108 and second inorganic core layer 1109 may be one of glass, silicon and/or ceramic.

As shown in FIG. 11, the first and second inorganic core layers 1108-1109 are embedded in the substrate 1100. Specifically, the first and second inorganic core layers 1108-1109 are in the substrate 1100 and surrounded by the first dielectric layer 1106.

The substrate 1100 also includes a first set of solder balls 1130 and a second set of solder balls 1132. The die 1102 is coupled (e.g., mounted) to the substrate 1100 through the first set of solder balls 1130. The second set of solder balls 132 is configured to be coupled to a printed circuit board (PCB).

FIG. 11 also illustrates that the first via 1124, the second via 1126, and the third via 1128 traverse through the first dielectric layer 1106. The first via 1124 also traverses the first inorganic core layer 1108. The third via 1128 also traverses the second inorganic core layer 1109. The first via 1124, the second via 1126, and the third via 1128 are coupled to the first set of pads 1120 and the second set of pads 1122.

FIG. 11 also illustrates that the die 1102 is covered with a mold/mold layer 500. In some implementations, the mold/mold layer 1140 is configured to provide a protective layer for the die 1102. The mold/mold layer 1140 also covers the solder resist layer 1110 and the first set of solder balls 1130.

FIG. 11 further illustrates that the substrate 1100 includes several buildup layers. Specifically, FIG. 11 illustrates that the substrate 1100 includes a first buildup layer 1142 and a second buildup layer 1144. The first and second buildup layers 1142 & 1144 include a dielectric layer. The first buildup layer 1142 also includes a set of trace 1146. The second buildup layer 1144 includes a set of traces 1148. In some implementations, additional buildup layers may be provided on the substrate 1100.

In some implementations, the ICs/dies on the substrates shown in FIGS. 10-11 are covered with a stiffener attachment, instead of a mold.

Exemplary Electronic Devices

Figure 12:
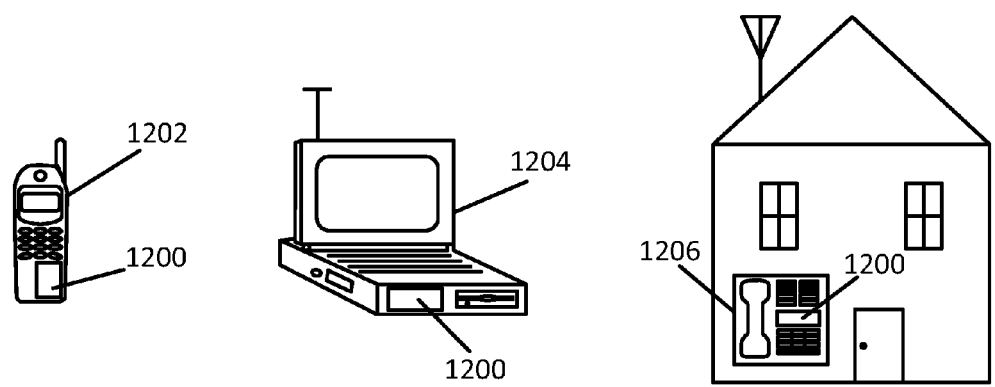
FIG. 12 illustrates various electronic devices that may integrate an integrated circuit and/or PCB described herein.

FIG. 12 illustrates various electronic devices that may be integrated with any of the aforementioned semiconductor device, integrated circuit, die, interposer or package. For example, a mobile telephone 1202, a laptop computer 1204, and a fixed location terminal 1206 may include an integrated circuit (IC) 1200 as described herein. The IC 1200 may be, for example, any of the integrated circuits, dice or packages described herein. The devices 1202, 1204, 1206 illustrated in FIG. 12 are merely exemplary. Other electronic devices may also feature the IC 1200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8A-8E, 9, 10, 11 and/or 12 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a substrate including:
      a first core layer comprising a first Young's Modulus;
      a second core layer laterally located relative to the first core layer in the substrate;
      a first inorganic core layer laterally positioned between the first core layer and the second core layer, the first inorganic core layer comprising a second Young's Modulus that is greater than the first Young Modulus, wherein the first inorganic core layer is thicker than the first and second core layers;
      a dielectric layer covering the first core layer, the second core layer and the first inorganic core layer; and
   a die coupled to the substrate, wherein the first inorganic core layer is vertically aligned with the die.

2. The integrated device of claim 1, wherein the first inorganic core layer has a first coefficient of thermal expansion (CTE), the die has a second coefficient of thermal expansion, and the first core layer has a third coefficient of thermal expansion (CTE), wherein the second CTE of the die is closer to the first CTE of the first inorganic core layer than the third CTE of the first core layer.

3. The integrated device of claim 1, wherein the second Young's Modulus is at least 1.35 times greater than the first Young's Modulus.

4. The integrated device of claim 1, wherein the first inorganic core layer is one of at least glass, silicon and/or ceramic.

5. The integrated device of claim 1 further comprising a second inorganic core layer laterally positioned between the first core layer and the second core layer, the first and second inorganic core layers are vertically aligned with the die.

6. The integrated device of claim 1, further comprising at least one via that traverses through the first inorganic core layer.

7. The integrated device of claim 1, wherein the die is configured to be coupled to one of at least a mold or a stiffener attachment.

8. The integrated device of claim 1, further comprising a buildup layer.

9. The integrated device of claim 1, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

10. An apparatus comprising:
    a first core layer comprising a first Young's Modulus;
    a second core layer laterally located relative to the first core layer in the apparatus;
    a means for reducing warpage if a die is coupled to the apparatus, the means laterally positioned between the first core layer and the second core layer, the means for reducing warpage comprising a second Young's Modulus that is greater than the first Young's Modulus, wherein the means for reducing warpage is thicker than the first and second core layers;
a dielectric layer covering the first core layer, the second core layer and the means for reducing warpage; and
a die coupled to the apparatus, wherein the means for reducing warpage is vertically aligned with the die.

11. The apparatus of claim 10, wherein the means for reducing warpage has a first coefficient of thermal expansion (CTE), the die has a second coefficient of thermal expansion, and the first core layer has a third coefficient of thermal expansion (CTE), wherein the second CTE of the die is closer to the first CTE of the means for reducing warpage than the third CTE of the first core layer.

12. The apparatus of claim 10, wherein the second Young's Modulus is at least 1.35 times greater than the first Young's Modulus.

13. The apparatus of claim 10, wherein the means for reducing warpage is one of at least glass, silicon and/or ceramic.

14. The apparatus of claim 10, wherein the means for reducing warpage comprises a first inorganic core layer and a second inorganic core layer, the first and second core layers laterally positioned between the first core layer and the second core layer, the first and second inorganic core layers are vertically aligned with the die.

15. The apparatus of claim 10, further comprising at least one via that traverses through the means for reducing warpage.

16. The apparatus of claim 10, wherein the die is configured to be coupled to one of at least a mold or a stiffener attachment.

17. The apparatus of claim 1, further comprising a buildup layer.

18. The apparatus of claim 10, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

19. A integrated device, prepared by a process comprising:
providing a first core layer comprising a first Young's Modulus;
providing a second core layer laterally located relative to the first core layer in the substrate;
providing a first inorganic core layer and laterally positioning the first inorganic core layer between the first core layer and the second core layer, wherein providing the first inorganic core layer further comprises selecting the first inorganic core layer that comprises a second Young's Modulus that is greater than the first Young's Modulus, wherein the first inorganic core layer is thicker than the first and second core layers;
providing a dielectric layer covering the first core layer, the second core layer and the first inorganic core layer;
and coupling a die to the substrate and vertically aligning the die with the first inorganic core layer.

* * * * *